United States Patent [19]

Takemura et al.

[11] Patent Number: 4,943,730
[45] Date of Patent: Jul. 24, 1990

[54] CHARGED PARTICLE BEAM LITHOGRAPHY METHOD

[75] Inventors: Hitoshi Takemura; Nobuo Gotoh; Moriyuki Isobe, all of Tokyo, Japan

[73] Assignee: JEOL Ltd., Tokyo, Japan

[21] Appl. No.: 407,576

[22] Filed: Sep. 15, 1989

[30] Foreign Application Priority Data

Sep. 19, 1988 [JP] Japan ................................ 63-234254
Sep. 19, 1988 [JP] Japan ................................ 63-234255

[51] Int. Cl.$^5$ ........................................ H01J 37/302
[52] U.S. Cl. ................................. 250/492.3; 250/398
[58] Field of Search ............ 250/492.22, 492.3, 492.2, 250/398

[56] References Cited

U.S. PATENT DOCUMENTS 4,063,103 12/1977 Sumi ................................ 250/492.2
4,530,064 7/1985 Takigawa et al. ................ 364/523
4,818,885 4/1989 Davis et al. ...................... 250/492.2

Primary Examiner—Jack I. Berman
Attorney, Agent, or Firm—Webb, Burden, Ziesenheim & Webb

[57] ABSTRACT

A charged particle beam lithography method wherein the workpiece material is mounted on a stage the position of which is detected by a laser interferometer. Patterns are expanded or reduced by a scaling factor by the steps of adjusting the gain of the deflection system controlling the charged particle beam and adjusting the size of movements of the stage in accordance with the scaling factor.

7 Claims, 2 Drawing Sheets

CHARGED PARTICLE BEAM LITHOGRAPHY METHOD

FIELD OF THE INVENTION

This invention relates to a charged particle beam lithography method facilitating expanding or reducing the size of all patterns to be written.

BACKGROUND OF THE INVENTION

A charged particle beam lithography system such as the electron beam lithography system or the ion beam lithography system focuses the charged particle beam from the charged particle beam generating means onto the material on which patterns are to be written. The material is scanned with said charged particle beam by using a deflection system. Scanning is based on the size of each pattern to be written and the computer stored data corresponding to the writing position. Thus, each specified pattern is written on the material.

Optical devices that are formed by charged particle beam lithography include those that have grating patterns with various pitches. These optical devices are designed to be irradiated with various wavelengths to analyze the irradiating light. In fabricating these optical devices, it may be desired to reduce or expand the size of the grating pattern obtained by lithography in order to set the resolution of light at the desired value. In such a case, the conventional art multiplies the computer stored data by a scaling factor when converting the data from the pattern source data (design data) into writing data that can be handled by the lithography system. Otherwise, the computer stored source data is redesigned according to the scaling factor. Such a scaling is disclosed in U.S. Pat. No. 4,530,064.

In a lithography system wherein the number of bits of the digital circuit for converting the deflection signal into an analog signal is finite, there exists a minimum value of data increment. Thus, the former method which multiplies the data by a scaling factor when converting the source data into the writing data cannot change the pattern pitch data to a value smaller than the minimum value of the aforementioned data increment and the data is rounded by this minimum value. For example, when the data representing pitch between the grating patterns corresponds 100 nm and the minimum increment value is 5 nm, the pitch data becomes 95 nm, even if the pitch data is multiplied by the scaling factor 0.99. On the other hand, the latter method has a problem that the source data must be redesigned according to the scaling factor, which requires much computer processing time.

SUMMARY OF THE INVENTION

One object of this invention is to provide a charged particle beam lithography method that permits writing patterns by scaling (without being restricted by the minimum value of the data increment) while stitching writing patterns that extend over a plurality of writing fields.

Another object of this invention is to provide a charged particle beam lithography method that permits writing patterns by simple scaling while stitching writing patterns that extend over a plurality of writing fields.

A further object of this invention is to provide a charged particle beam lithography method that permits monitoring the deviation (error) of the current workpiece material position from the target position based on a signal from an interferometer and writing patterns by scaling while stitching fields with high accuracy and correcting the amount of deflection of the aforementioned electron beam based on the signal representing said error.

Briefly, according to this invention, a pattern is written to fields the position of which are controlled with a high precision laser interferometer. The laser interferometer is the reference of length. All patterns to be written are normally larger than the deflection range (deflection field) of the beam. In other words, all patterns to be written extend over a plurality of writing fields. In writing such patterns, patterns written in a plurality of fields are stitched. After writing patterns in a field by beam deflection, the stage is shifted to present the next field, thus repeating a sequence of processes of writing patterns in fields by beam deflection. The patterns must be stitched in a satisfactory manner. Thus, adjustment is made to match the amount of movement of one field (reference amount of stage movement) and the deflection amount of one field of the beam (reference amount of deflection) with each other before writing a pattern both in the X and Y moving directions. For this purpose, the gain of an analog amplifier for amplifying the deflection signal to be applied to the deflector is adjusted and the reference movement amount of the stage is changed by a reduction or expansion factor (scaling factor) before writing the pattern so that the reference deflection amount of the charged particle beam agrees with the changed reference movement amount of the stage. Patterns extending over a plurality of fields can be written by simple scaling without being restricted by the minimum value of the aforementioned data increment after these steps.

That is to say, the charged particle beam lithography method according to this invention controls the gain of the deflection system amplifier for sending the deflection signal to the charged beam deflector. It also converts the data that represents the intended movement of the stage required for the shift of the writing field into a signal according to the scaling factor. In one embodiment, the laser interferometer is set so that the counts from the laser interferometer that represent how many times greater the measurement distance is than the laser beam wavelength becomes the reciprocal multiple of the scaling factor. The stage is moved by one writing field expanded or reduced by the scaling factor. The pattern data is converted into an analog signal to apply it to the deflection system, and thereby deflects the charged particle beam by an amount according to the scaling factor to write patterns in the field. Patterns are written with high accuracy without being restricted by the minimum value of the data increment of the data format of the pattern data.

DESCRIPTION OF THE PREFERRED EMBODIMENTS

Figure 1:
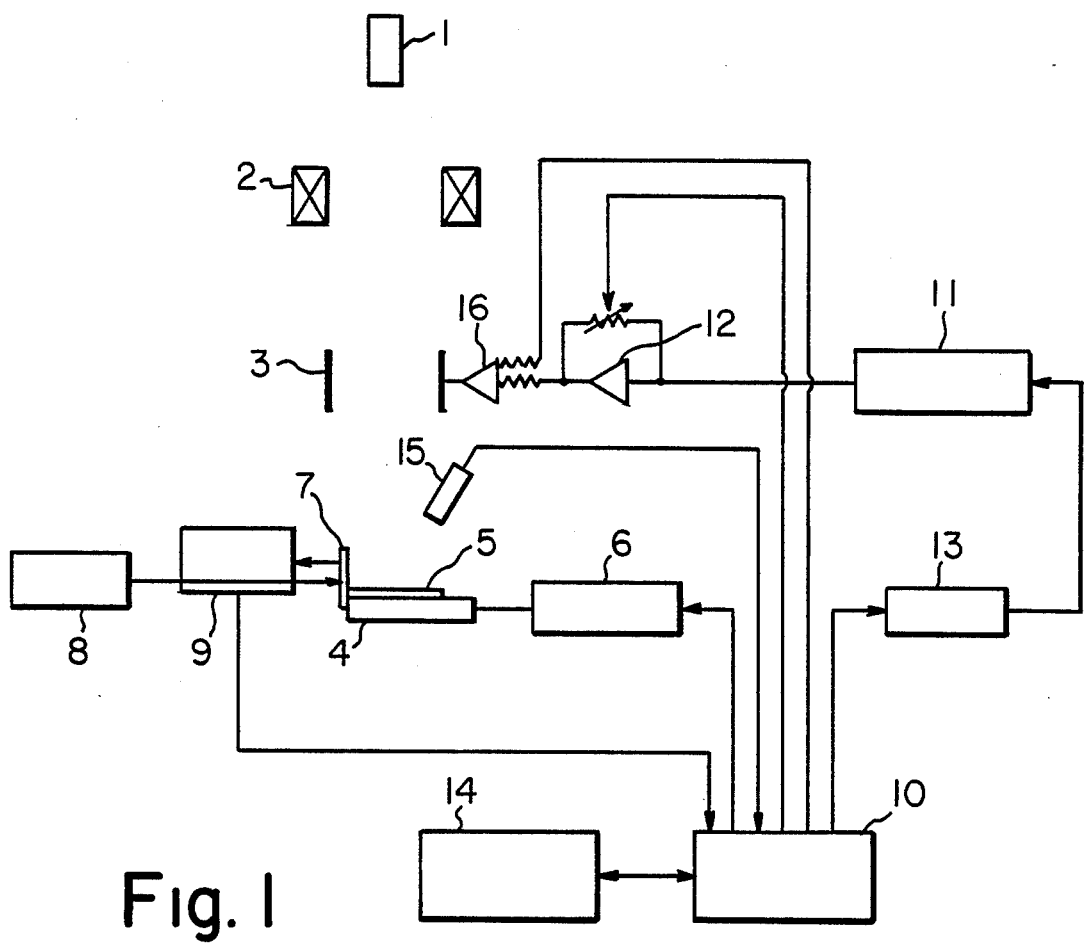
FIG. 1 is a schematic illustration of the electron beam lithography system shown as an embodiment of the system which is used to practice the method of the present invention.

Referring to FIG. 1, an electron beam lithography system for use in the charged particle beam lithography method according to this invention, comprises an electron gun 1, a focusing lens 2, deflectors 3 (actually, X-direction deflector and Y-deflector are disposed), a stage 4, material workpiece 5 mounted on the stage, a stage drive mechanism 6, a reflection mirror 7, a laser oscillator 8, and a photodetector module 9.

The laser interferometer comprises the reflection mirror 7, laser oscillator 8 and photodetector module 9. A control unit 10 (for example, a programmed digital computer) is provided with associated writing data storage (memory) 14. The writing pattern data from the writing data storage 14 is sent to various registers in the control unit 10. A deflection signal generating circuit 11, an amplifier 12, and a D-A converter 13 control the deflection.

A mark is inscribed on the workpiece or material 5 and a backscattered electron detector 15 detects when the mark is disposed directly above said material. Summing amplifier 16 relates to an alternate embodiment in which stage position error is corrected by offsetting the deflection signals. The signal detected by said detector 15 is amplified by an amplifier (not illustrated) and is sent to said control unit 10. Since mark position detection is quite common in electron beam lithography, it need not be described in detail here. In said control unit 10, said mark position is determined based on the mark signal from the aforementioned detector 15.

The aforementioned photodetector module 9 has a half mirror in it. The laser beam coming from the laser oscillator 8 is split into two light paths by this half mirror, one of which is incident on the reflection mirror 7 installed on the side of the stage 24 and the other of which irradiates the reference reflection mirror installed inside. Therefore, the brightness of the surface of the aforementioned half mirror changes depending on whether or not the interference conditions are satisfied between the two reflection beams. In this particular high precision interferometer, each time the stage 4 moves a distance equivalent to 1/64 wavelength of the laser beam, the detected portion on the half mirror changes brightness from dark to bright. The photodetector module 9 detects the change in the brightness and generates one detection pulse for each 1/64 wavelength and sends the count signal of the pulse to the control unit 10 as the stage movement or positional information.

In this embodiment, the reference movement amount of the stage, when scaling is not performed, is an amount equivalent to one-half of the moving distance for one field given as F/2. The counts of the number of interference fringes of the laser interferometer corresponding to F/2 is given as Fn. The deflection signal value required to deflect the beam by the deflector by F/2 is given as If. Here, it is assumed that adjustment has already been made so that the deflecting direction of the beam agrees with the traveling direction of the stage. Under these conditions, it is assumed that all the patterns to be written are reduced K percent, for example. Input means are part of the control unit 10, enabling the percent expansion or reduction to be set. Here, the control unit 10 performs the following processing before starting pattern writing. First, the stage is moved so that the mark inscribed on the material is disposed directly under the optical axis. Then the mark is irradiated by scanning the beam finely around the optical axis, and the mark is detected by detecting the mark signal issued by the backscattered electron detector 15 as a result of irradiation. Then, the operator sets registers in the control unit 10 after multiplying the target movement amount data F/2 of the stage by (100K)/100 so that the reference movement amount of the stage is reduced K percent. That is to say, when the data representing the movement amount of the stage for moving one field F/2 is sent to the control unit 10, the control unit 10 sets the data in the aforementioned registers after performing the aforementioned arithmetic operation of the data. Then the control unit adjusts the gain of the deflection amplifier mentioned previously so as to match the beam reference deflection amount with the changed reference movement amount of the stage. It is assumed that in the condition prior to this adjustment, the gain of the deflection system amplifier is set to Gm. If the controller gives a command to move the field, the control unit 10 controls the stage drive mechanism while comparing the signal representing the stage movement amount from the laser interferometer with the data set in the aforementioned registers and moves the stage 4 in the X direction by (F/2) (100−K)/100, which is an amount reduced K percent as compared with the amount in normal writing. Then the signal applied from the deflection signal generating circuit 13 to the deflector 3 (for X direction) is changed gradually by the command of the control unit 10 and the material is scanned slowly with the beam in the X direction.

Given that It is the deflection signal when the mark is detected by this scan, the control unit 10 changes the gain of the aforementioned deflection system amplifier 14 (for X direction) to Gn=Gm·It/If.

The control unit 10 makes the same adjustment in the Y direction. If the linearity of the deflection system amplifier is insufficient, it suffices to correct the gain of the deflection system amplifier obtained by the above setting by the gain correction amount measured previously.

In a condition in which signal If is applied to the deflector 3, the gain may also be changed by moving the electron beam irradiating position by changing the above gain gradually so as to fix the gain when the mark is detected in the center of the scanning area for mark detection. This can also be accomplished by measuring and storing the relationship between the scaling factor and gain setting signal in memory and reading the corresponding gain setting signal by the control unit 10 based on the signal that indicates the scaling factor, to set the gain automatically.

Figure 2:
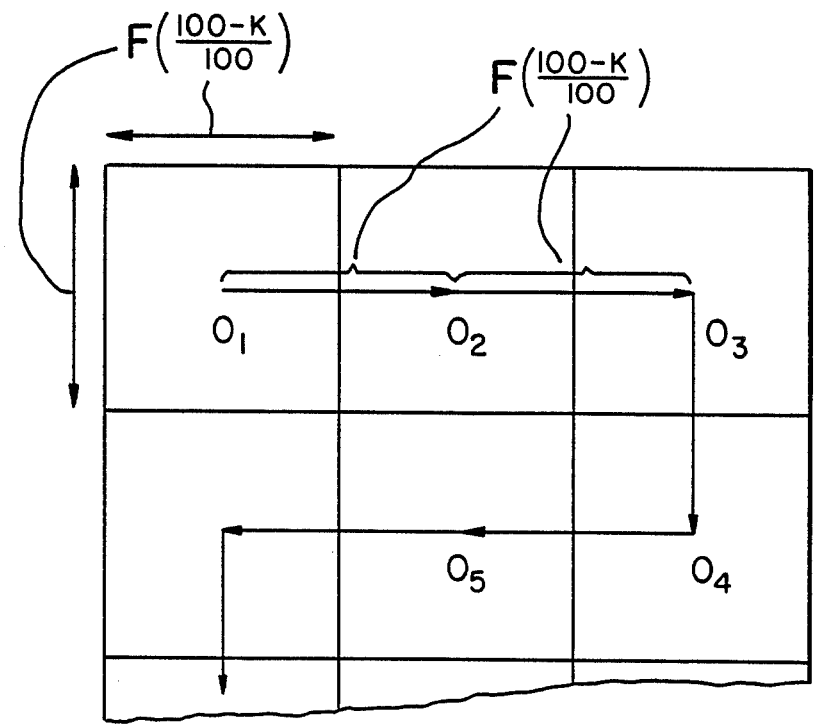
FIG. 2 is an illustration that describes the operation of the embodiment shown in FIG. 1.

In pattern writing, the electron beam is focused onto the material 5 through condenser lens 2 and a deflection signal is issued from the deflection signal generating circuit based on the command according to each pattern data. This deflection signal is sent to the deflection system through the D-A converter 13. Thereby, the electron beam scans the material to write each specified pattern on the material. When the pattern writing field is changed from one deflection field to the next in pattern writing, the stage drive mechanism 6 moves the stage 4 by the command of the control unit 10. Since the signal representing the target movement amount of the state is reduced K percent as mentioned above, the stage moves by F(100−K)/100, the amount of field-to-field movement F before the adjustment which is reduced by K percent. On the other hand, since the gain of the deflection amplifier is reduced K percent, all patterns written on the material 5 are reduced K percent when patterns are written by the deflector 12. FIG. 2 shows how patterns are written in each field, where symbols $0_1, 0_2, 0_3, 0_4 \ldots$ denote the center of each field and $0_1$ to $0_2, 0_2$ to $0_3$, and $0_3$ to $0_4, \ldots$ denote the amount of stage movement between each field. When the stage is moved between each field in the embodiment shown in FIG. 1 above, the amount of movement or position of the stage is measured by the photodetector module 9 of the laser interferometer and the control unit 10 obtains the deviation of the current position from the target position (error) of the stage and feeds back the signal representing said deviation (error) to the aforementioned deflection signal generating circuit. On the other hand, pattern data is sent from the writing data storage to the deflection signal generating circuit 11 through the aforementioned control unit 10 and the D-A converter 13, and the aforementioned deviation (error) signal is added to the pattern data signal in the deflection signal generating circuit 11. Therefore, the deflection signal which is corrected as aforementioned is applied to the deflector 3 through the amplifier 12, thereby the stage stop position error is corrected for writing.

Although the gain of the amplifier is changed by moving the stage by an amount (F/2) (100−K)/100 in the aforementioned embodiment, the change of the gain can be also practiced by moving the stage by an amount S(100−K)/100, where S is independent from F/2. When the gain adjustment of the aforementioned amplifier 12 is made before writing patterns in the first embodiment, the signal representing the deviation (error) of the movement amount from the intended amount of the stage is also sent to the amplifier 12 of which gain has been adjusted. As a consequence, the error signal is reduced by the aforementioned gain reduction (K percent) when it is fed back. The result is that the amount of correction of the laser measurement feedback system is K percent smaller. Therefore, the amount of feedback of the stage stop position error 1 to the beam will have an error of 1×K/100 and the field stitching accuracy will be insufficient unless the above point is not considered. Thus, this invention is so designed that the stage stop position error signal is not affected by the change in the gain of the aforementioned amplifier when it is fed back. Namely, the control unit 10 performs arithmetic operation of the signal representing the stage stop position error 1 based on the signal measured by the laser interferometer so as to make it 1×k/100 and adds this to the pattern data signal to correct the aforementioned error. As a result, the stage stop being free of error, the fields can be stitched with high accuracy and the pattern of the specified magnification can be written on the material. Strictly speaking, the amount of correction is $$l \times \sum_{n=1}^{\infty} (K/100)^n,$$

but in practice, 1×K/100 suffices.

As an alternative, the signal corresponding to the error 1×K/100 due to the above correction may be added to the target position signal of the stage. This will correct the beam projection position for the error due to said correction.

Although stage stop error signal is also amplified by the amplifier 12 in the aforementioned embodiment, another alternative is possible. In this embodiment, an amplifier for amplifying only the stage stop signal is provided in addition to the amplifier 12. The gain of the amplifier 12 is changed and only pattern data is amplified by the amplifier 12. On the other hand, the gain of the added amplifier is not changed and stage position error signal is fed to the deflector 3 only through the added amplifier. As a consequence, stage stop position error is not affected by a scaling factor.

Figure 3:
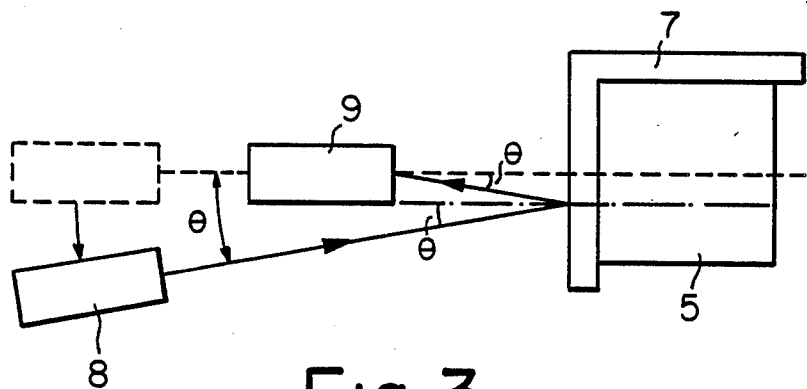
FIG. 3 is an illustration showing the key section of another electron beam lithography system for practicing this invention.

By these methods, the error of the feedback signal of the stage position stop error from the laser interferometer caused by change of the gain of the amplifier of the beam deflector can be prevented and the fields can be stitched with high accuracy. The aforementioned embodiments include conversion of the aforementioned target movement amount signal of the stage at the aforementioned percent and change of the gain of the aforementioned deflection system amplifier at the aforementioned percent. Other embodiments include the following: As shown in FIG. 3 which shows the laser interferometer as viewed from the direction of the optical axis, the position of the laser oscillator 8 is rotated by angle $\theta$ depending on the scaling factor, where $\Theta$ is the angle of incidence upon the reflection mirror 7. In this condition, the component of the wavelength in the direction of measuring the laser beam is $\lambda o \cos \Theta$ where $\lambda o$ is the wavelength detected when the beam direction is perpendicular to the reflection mirror 7. This produces the same effect as that when the wavelength of the laser beam is changed to $\lambda o \cdot \cos \theta$ to change the scaling factor. Therefore, it is also possible in this case to write reduced patterns on the material while stitching the patterns written in adjacent fields satisfactorily as in the case of the embodiments mentioned above if the gain of the deflection amplifier is adjusted according to the rotation of angle $\Theta$ of the aforementioned laser oscillator 8.

In the embodiment mentioned above, the counts from the aforementioned laser interferometer representing how many times greater the measurement distance is than the wavelength of the laser beam is set to be a reciprocal multiple of the aforementioned factor by changing the angle of incidence of the laser beam upon the reflection mirror provided on the aforementioned stage, but the wavelength of the laser beam may be changed by using a variable wavelength laser.

The counts from the laser interferometer may also be set at a reciprocal multiple to the aforementioned factor by using an electrical circuit which converts an original count signal to the desired signal without changing the wavelength. This invention can also be applied to other lithography methods using a charged particle beam in addition to ion beam lithography.

In a series of embodiments mentioned above wherein the counts from the aforementioned laser interferometer representing how many times greater the measurement distance is than the wavelength of the laser beam are set at a reciprocal multiple of the aforementioned factor, there does not occur the aforementioned error of the amount of feedback being too small even if the aforementioned error signal is applied to the amplifier, of which gain has been changed to correct the electron beam projection position.

This invention permits scaling with the accuracy based on the measurement accuracy of the laser interferometer while stitching the writing fields satisfactorily. That is to say, it permits writing patterns at smaller intervals than the width corresponding to the minimum value of the data increment that the data format has without being restricted by said minimum value or writing patterns of a width smaller than that corresponding to this minimum value. Unlike the conventional method, it is not necessary to covert all the source data to writing data each time the scaling factor is changed, and it suffices to convert the target movement amount signal of the aforementioned stage according to the aforementioned reduction or expansion factor or to change the counts from the aforementioned laser interferometer representing how many times greater the measurement distance is than the wavelength of the laser beam according to the aforementioned reduction or expansion factor and to change the gain of the aforementioned deflection system amplifier according to the aforementioned reduction or expansion factor, allowing patterns that have been scaled to be written simply within a short time.

Having thus described our invention with the detail and particularity required by the Patent Laws, what is claimed and desired to be protected by Letters Patent is set forth in the following claims.

What is claimed is:

1. In a charged particle beam lithography method wherein the workpiece material is mounted upon a stage the position of which is detected by a laser interferometer for positioning a writing field of the workpiece under the particle beam and wherein a particle beam deflection system directs the beam over the frame to write patterns upon each writing field of the workpiece, said deflection system comprising an amplifier for amplifying a deflection signal applied to deflector means, the movement of the stage to present new writing fields to the particle beam being controlled by digital writing field data stored in the memory of a controller and the patterns to be written to each writing field by deflection of the charged particle beam being controlled by pattern data stored in the memory of a controller, the improvement for permitting expanding or reducing the size of patterns according to a scaling factor comprising the steps for:
   (a) changing the gain of the deflection system amplifier for sending the deflection signal to the charged beam deflector according to the scaling factor,
   (b) converting the writing field data that represents the intended movement amount of the stage required for the shift of the writing field into a signal according to the scaling factor,
   (c) moving the stage by one writing field on the converted data signal,
   (d) comparing a count signal from the laser interferometer representing the position of the stage with said converted data signal to obtain a position error signal,
   (e) writing patterns in the field by deflecting the charged particle beam in accordance with digital pattern data signals converted into analog signals applied to the deflection system amplifier and correcting said deflection of the charged particle beam in accordance with the error signal, and
   (f) repeating the steps (c), (d) and (e).

2. A charged particle beam lithography method according to claim 1, wherein the error signal is corrected to correct beam projection position error that occurs by said error signal passing through the deflection system amplifier whose gain is changed.

3. A charged particle beam lithography method according to claim 1, wherein the digital writing field data is corrected to correct for the beam projection position error that occurs by said error signal passing through the deflection system amplifier whose gain is changed.

4. A charged particle beam lithography method according to claim 1, wherein the error signal is fed back to the deflection system through an amplifier which is different from the aforementioned amplifier and whose gain is not changed.

5. In a charged particle beam lithography method wherein the workpiece material is mounted upon a stage the position of which is detected by a laser interferometer for positioning a writing field of the workpiece under the particle beam and wherein a particle beam deflection system directs the beam over the frame to write patterns upon each writing field of the workpiece, said deflection system comprising an amplifier for amplifying a deflection signal applied to deflector means, the movement of the stage to present new writing fields to the particle beam being controlled by digital writing field data stored in the memory of a controller and the patterns to be written to each writing field by deflection of the charged particle beam being controlled by pattern data stored in the memory of a controller, the improvement for permitting expanding or reducing the size of patterns according to a scaling factor comprising the steps for:
   (a) changing the gain of the deflection system amplifier for sending the deflection signal to the charged beam deflector according to the scaling factor,
   (b) setting the laser interferometer so that the counts from the laser interferometer that represents how many times greater the measurement distance is than the laser beam wavelength become the reciprocal multiple of the scaling factor as compared with case of not scaling,
   (c) moving the stage by one writing field on the signal that represents the intended movement amount of the stage,
   (d) comparing the count signal from the laser interferometer representing position of the stage with the signal representing the intended position of the stage, and obtaining the signal representing position error,
   (e) writing patterns in the field by deflecting the charged particle beam in accordance with digital pattern data signals converted into analog signals applied to the deflection system amplifier and correcting said deflection of the charged particle beam for the error signal, and
   (f) repeating the steps (c), (d) and (e).

6. A charged particle beam lithography method according to claim 5, wherein the laser interferometer comprises a laser beam that is split into a measurement beam and a reference beam by a beam splitter and the measurement beam is directed back to a photodetector for measuring the interference between the measurement and detector beams by a reflecting mirror on the stage, and wherein the interferometer is set so that the counts from the laser interferometer become the reciprocal multiple of the scaling factor as compared with case of not scaling by changing the angle of incidence of laser beam upon the reflecting mirror on the stage.

7. A charged particle beam lithography method according to claim 5, wherein the laser interferometer is set so that the counts from the laser interferometer become the reciprocal multiple of the aforementioned scaling factor as compared with case of not scaling by changing the wavelength of the laser beam from the laser interferometer.

* * * * *

UNITED STATES PATENT AND TRADEMARK OFFICE
CERTIFICATE OF CORRECTION

PATENT NO. : 4,943,730

DATED : July 24, 1990

INVENTOR(S) : Hitoshi Takemura, Nobuo Gotoh and Moriyuki Isobe

It is certified that error appears in the above-identified patent and that said Letters Patent is hereby corrected as shown below:

Column 3 Line 44 "1/64" should read --1/2--.

Column 3 Line 48 "one detection pulse for each 1/64" should read --80 detection pulses for each 1/2--.

Signed and Sealed this

Twenty-first Day of April, 1992

Attest:

HARRY F. MANBECK, JR.

*Attesting Officer*  *Commissioner of Patents and Trademarks*